(12) United States Patent
Daniel et al.

(10) Patent No.: US 8,341,449 B2
(45) Date of Patent: Dec. 25, 2012

(54) BATTERY MANAGEMENT SYSTEM AND METHOD FOR TRANSFERRING DATA WITHIN THE BATTERY MANAGEMENT SYSTEM

(75) Inventors: Vaughan Daniel, Ann Arbor, MI (US); Michael Trader, Royal Oak, MI (US); JongMin Park, Sterling Heights, MI (US); David C. Robertson, Royal Oak, MI (US)

(73) Assignee: LG Chem, Ltd., Seoul (KR)

( * ) Notice: Subject to any disclaimer, the term of this patent is extended or adjusted under 35 U.S.C. 154(b) by 223 days.

(21) Appl. No.: 12/822,285

(22) Filed: Jun. 24, 2010

(65) Prior Publication Data

US 2011/0258471 A1    Oct. 20, 2011

Related U.S. Application Data

(60) Provisional application No. 61/324,788, filed on Apr. 16, 2010.

(51) Int. Cl.
*G06F 1/26* (2006.01)
(52) U.S. Cl. ...................................... 713/340
(58) Field of Classification Search ........... 713/300–340
See application file for complete search history.

(56) References Cited

U.S. PATENT DOCUMENTS

| | | | |
|---|---|---|---|
| 4,390,841 A | 6/1983 | Martin et al. | |
| 5,578,915 A | 11/1996 | Crouch, Jr. et al. | |
| 5,606,242 A | 2/1997 | Hull et al. | |
| 5,644,212 A | 7/1997 | Takahashi | |
| 5,652,502 A | 7/1997 | Van Phuoc et al. | |
| 5,654,623 A | * 8/1997 | Shiga et al. | 320/106 |
| 5,658,682 A | 8/1997 | Usuda et al. | |
| 5,694,335 A | 12/1997 | Hollenberg | |
| 5,701,068 A | 12/1997 | Baer et al. | |
| 5,714,866 A | 2/1998 | S et al. | |
| 5,739,670 A | 4/1998 | Brost et al. | |
| 5,796,239 A | 8/1998 | van Phuoc et al. | |
| 5,825,155 A | 10/1998 | Ito et al. | |
| 5,936,385 A | 8/1999 | Patillon et al. | |
| 6,016,047 A | 1/2000 | Notten et al. | |

(Continued)

FOREIGN PATENT DOCUMENTS

JP    9243716 A    9/1997

(Continued)

OTHER PUBLICATIONS

International Search Report dated Jul. 25, 2005 for International Application No. PCT/KR2004/003103.

(Continued)

*Primary Examiner* — Raymond Phan
(74) *Attorney, Agent, or Firm* — John F. Buckert; Buckert Patent & Trademark Law Firm, P.C.

(57) ABSTRACT

A battery management system is provided. The system includes a battery monitoring device having a microprocessor and a hardware component. The microprocessor identifies a non-modifiable node ID from the hardware component. The microprocessor also obtains operational parameters associated with the at least one battery cell. The microprocessor computes a network ID for the battery monitoring device based on the non-modifiable node ID. The system further includes a main controller that communicates with the battery monitoring device via a communication bus utilizing the network ID.

8 Claims, 3 Drawing Sheets

U.S. PATENT DOCUMENTS

| | | | |
|---|---|---|---|
| 6,064,180 A | 5/2000 | Sullivan et al. | |
| 6,160,376 A | 12/2000 | Kumar et al. | |
| 6,232,744 B1 | 5/2001 | Kawai et al. | |
| 6,285,163 B1 | 9/2001 | Watanabe et al. | |
| 6,329,823 B2 | 12/2001 | Blessing et al. | |
| 6,353,815 B1 | 3/2002 | Vilim et al. | |
| 6,359,419 B1 | 3/2002 | Verbrugge et al. | |
| 6,362,598 B2 | 3/2002 | Laig-Horstebrock et al. | |
| 6,441,586 B1 | 8/2002 | Tate, Jr. et al. | |
| 6,515,454 B2 | 2/2003 | Schoch | |
| 6,534,954 B1 | 3/2003 | Plett | |
| 6,563,318 B2 | 5/2003 | Kawakami et al. | |
| 6,583,606 B2 | 6/2003 | Koike et al. | |
| 6,608,482 B2 | 8/2003 | Sakai et al. | |
| 6,646,421 B2 | 11/2003 | Kimura et al. | |
| 6,661,201 B2 | 12/2003 | Ueda et al. | |
| 6,724,172 B2 | 4/2004 | Koo | |
| 6,794,849 B2 * | 9/2004 | Mori et al. | 320/107 |
| 6,829,562 B2 | 12/2004 | Sarfert | |
| 6,832,171 B2 | 12/2004 | Barsoukov et al. | |
| 6,876,175 B2 | 4/2005 | Schoch | |
| 6,892,148 B2 | 5/2005 | Barsoukov et al. | |
| 6,919,952 B2 | 7/2005 | Kruit | |
| 6,927,554 B2 | 8/2005 | Tate, Jr. et al. | |
| 6,943,528 B2 | 9/2005 | Schoch | |
| 6,967,466 B2 | 11/2005 | Koch | |
| 6,984,961 B2 | 1/2006 | Kadouchi et al. | |
| 7,012,434 B2 | 3/2006 | Koch | |
| 7,039,534 B1 | 5/2006 | Ryno et al. | |
| 7,061,246 B2 | 6/2006 | Dougherty et al. | |
| 7,072,871 B1 | 7/2006 | Tinnemeyer | |
| 7,098,665 B2 | 8/2006 | Laig-Hoerstebrock | |
| 7,109,685 B2 | 9/2006 | Tate, Jr. et al. | |
| 7,126,312 B2 | 10/2006 | Moore | |
| 7,136,762 B2 | 11/2006 | Ono | |
| 7,138,775 B2 | 11/2006 | Sugimoto et al. | |
| 7,197,487 B2 | 3/2007 | Hansen et al. | |
| 7,199,557 B2 | 4/2007 | Anbuky et al. | |
| 7,228,447 B1 * | 6/2007 | Day | 713/340 |
| 7,233,128 B2 | 6/2007 | Brost et al. | |
| 7,250,741 B2 | 7/2007 | Koo et al. | |
| 7,253,587 B2 | 8/2007 | Meissner | |
| 7,315,789 B2 | 1/2008 | Plett | |
| 7,317,300 B2 | 1/2008 | Sada et al. | |
| 7,321,220 B2 | 1/2008 | Plett | |
| 7,327,147 B2 | 2/2008 | Koch | |
| 7,394,394 B2 | 7/2008 | Lockhart et al. | |
| 7,400,115 B2 | 7/2008 | Plett | |
| 7,424,663 B2 | 9/2008 | Mehalel | |
| 7,446,504 B2 | 11/2008 | Plett | |
| 7,518,339 B2 | 4/2009 | Schoch | |
| 7,521,895 B2 | 4/2009 | Plett | |
| 7,525,285 B2 | 4/2009 | Plett | |
| 7,558,701 B2 * | 7/2009 | Andarawis et al. | 702/183 |
| 7,576,518 B2 | 8/2009 | Sanders et al. | |
| 7,583,059 B2 | 9/2009 | Cho | |
| 7,589,532 B2 | 9/2009 | Plett | |
| 7,593,821 B2 | 9/2009 | Plett | |
| 7,710,073 B2 * | 5/2010 | Yamauchi et al. | 320/128 |
| 2003/0015993 A1 | 1/2003 | Misra et al. | |
| 2003/0184307 A1 | 10/2003 | Kozlowski et al. | |
| 2005/0100786 A1 | 5/2005 | Ryu et al. | |
| 2005/0127874 A1 | 6/2005 | Lim et al. | |
| 2006/0017582 A1 | 1/2006 | Lockhart et al. | |
| 2006/0100833 A1 | 5/2006 | Plett | |
| 2007/0118301 A1 | 5/2007 | Andarawis et al. | 702/33 |
| 2007/0120533 A1 | 5/2007 | Plett | |
| 2008/0071473 A1 * | 3/2008 | Choi | 701/211 |
| 2008/0094035 A1 | 4/2008 | Plett | |
| 2008/0143543 A1 | 6/2008 | Vandensande et al. | |
| 2008/0180106 A1 * | 7/2008 | Gorbold | 324/434 |
| 2008/0249726 A1 | 10/2008 | Plett | |
| 2010/0097034 A1 * | 4/2010 | Shu et al. | 320/126 |
| 2010/0241377 A1 * | 9/2010 | Kagawa | 702/63 |
| 2011/0154084 A1 * | 6/2011 | Vandwalle et al. | 713/324 |

FOREIGN PATENT DOCUMENTS

| | | | |
|---|---|---|---|
| JP | 9312901 A | 12/1997 | |
| JP | 11003505 A | 1/1999 | |
| JP | 11023676 A | 1/1999 | |
| JP | 11032442 A | 2/1999 | |
| JP | 11038105 A | 2/1999 | |
| JP | 2002228730 A | 8/2002 | |
| JP | 2002319438 A | 10/2002 | |
| JP | 2002325373 A | 11/2002 | |
| JP | 2003516618 A | 5/2003 | |
| JP | 2003249271 A | 9/2003 | |
| JP | 2003257501 A | 9/2003 | |
| JP | 2004031014 A | 1/2004 | |
| JP | 2004521365 A | 7/2004 | |
| JP | 2006516326 A | 6/2009 | |
| KR | 19970024432 A | 5/1997 | |
| KR | 20020026428 A | 4/2002 | |
| WO | WO0067359 A1 | 11/2000 | |

OTHER PUBLICATIONS

International Search Report dated Mar. 31, 2005 for International Application No. PCT/KR2004/003332.

International Search Report dated Dec. 1, 2006 for International Application No. PCT/KR2006/003305.

S. Moore, P. Schneider; A review of Cell Equalization Methods for Lithium Ion and Lithium Polymer Battery Systems; 2001 Society of Automotive Engineers; Jan. 2001; pp. 1-5.

G. Plett; Advances in EKF SOC Estimation for LiPB HEV Battery Packs; Powering Sustainable Transportation EVS 20; Nov. 15-19, 2003; Long Beach, CA; pp. 1-12.

G. Welch, G. Bishop; An Introduction to the Kalman Filter; SIGGRAPH 2001 Course 8; Los Angeles, CA; Aug. 12-17, 2001; http://info.acm.org/pubs/toc/CRnotice.html, pp. 1-80.

E. Wan, A. Nelson; Dual Extended Kalman Filter Methods; Kalman Filtering and Neural Networks; 2001; pp. 123-173.

Yon et al.; Dynamic Multidimensional Wavelet Neural Network and its Application; Journal of Advanced Computational Intelligence and Intelligent Informatics; 2000; vol. 4, No. 5; pp. 336-340.

Fletcher et al; Estimation from Lossy Sensor Data: Jump Linear Modeling and Kalman Filtering; IPSN Apr. 26-27, 2004; Berkeley, California; pp. 251-258.

G. Plett; Extended Kalman Filtering for Battery Managements System of LiPB-based HEV Battery Packs—Part 1 Background; Journal of Power Sources 134; 2004; pp. 252-261.

G. Plett; Extended Kalman Filtering for Battery Managements System of LiPB-based HEV Battery Packs—Part 2 Background; Journal of Power Sources 134; 2004; pp. 262-276.

G. Plett; Extended Kalman Filtering for Battery Managements System of LiPB-based HEV Battery Packs—Part 3 Background; Journal of Power Sources 134; 2004; pp. 277-283.

G. Plett; Kalman-Filter SOC Estimation for LiPB HEV Cells; The 19th International Battery, Hybrid and Fuel Electric Vehicle Symposium and Exhibition; Oct. 19-23, 2002; Busan, Korea; pp. 1-12.

G. Plett; LiPB Dynamic Cell Models for Kalman-Filter SOC Estimation; The 19th International Battery, Hybrid and Fuel Electric Vehicle Symposium and Exhibition; Oct. 19-23, 2002; Busan, Korea; pp. 1-12.

S.C. Rutan; Recursive Parameter Estimation; 1990; Journal of Chemometrics; vol. 4; pp. 103-121.

P. Maybeck; Stochastic models, estimation and control, vol. 1; 1979; Academic Press Inc., 32 pp.

T. Hansen, C.J. Wang; Support vector based battery state of charge estimator; Journal of Power Sources, 2004; 6391; pp. 1-8.

V. Johnson et al.; Temperature-Dependent Battery Models for High-Power Lithium-Ion Batteries; Jan. 2001; NREL/CP-540-28716; 17th Annual Electric Vehicle Symposium Oct. 15-18, 2000.

* cited by examiner

| DEVICE NO. | NODE ID | ENABLED MAP | DESCRIPTION xxTT TTVV VVVV VVVV |
|---|---|---|---|
| 1 | 0x42 | 0x3FDE | 0011 1111 1101 1110 |
| 2 | 0x44 | 0x3FDE | 0011 1111 1101 1110 |
| 3 | 0x46 | 0x3FDE | 0011 1111 1101 1110 |
| 4 | 0x48 | 0x3FDE | 0011 1111 1101 1110 |
| 5 | 0x4A | 0x3FDE | 0011 1111 1101 1110 |
| 6 | 0x4C | 0x1CDE | 0001 1100 1101 1110 |
| 7 | 0x4E | 0x3FDE | 0011 1111 1101 1110 |
| 8 | 0x50 | 0x3FDE | 0011 1111 1101 1110 |
| 9 | 0x52 | 0x3FDE | 0011 1111 1101 1110 |
| 10 | 0x54 | 0x3FDE | 0011 1111 1101 1110 |
| 11 | 0x56 | 0x3FDE | 0011 1111 1101 1110 |
| 12 | 0x40 | 0x0000 | 0000 0000 0000 0000 |
|  |  |  | x = DON'T CARE |
|  |  |  | T = TEMPERATURE |
|  |  |  | V = VOLTAGE |

| NODE ID | STARTING NETWORK ID |
|---|---|
| 0x42 | 0x210 |
| 0x43 | 0x218 |

BATTERY MANAGEMENT SYSTEM AND METHOD FOR TRANSFERRING DATA WITHIN THE BATTERY MANAGEMENT SYSTEM

CROSS-REFERENCE TO RELATED APPLICATIONS

This application claims priority to U.S. Provisional Patent Application No. 61/324,788 filed on Apr. 16, 2010, the entire contents of which are hereby incorporated by reference herein.

BACKGROUND

Battery systems typically have components that monitor a voltage of a battery cell. However, when the components are in a distributed network, typically DIP switches have been utilized to select addresses of the components. However, an inherent problem with the foregoing technique for selecting an address of a component is that a person may inadvertently select an incorrect address, or select an address that is already assigned to another component. Further, the DIP switch can become degraded or damaged which could result in an incorrect address being utilized by a component.

Accordingly, the inventors herein have recognized a need for an improved battery management system.

SUMMARY

A method for transferring data within a battery management system in accordance with an exemplary embodiment is provided. The battery management system has a battery monitoring device, a communication bus, and a main controller. The method includes identifying a non-modifiable node ID associated with the battery monitoring device from a hardware component of the battery monitoring device, utilizing a microprocessor of the battery monitoring device. The method further includes computing a network ID for the battery monitoring device based on the non-modifiable node ID, utilizing the microprocessor. The method further includes measuring operational parameters associated with at least one battery cell, utilizing the battery monitoring device. The method further includes transmitting data corresponding to the measured operational parameters from the microprocessor through the communication bus to the main controller, utilizing the network ID.

A battery management system in accordance with another exemplary embodiment is provided. The battery management system includes a battery monitoring device having a microprocessor and a hardware component. The microprocessor is configured to identify a non-modifiable node ID from the hardware component. The microprocessor is further configured to obtain operational parameters associated with the at least one battery cell. The microprocessor is further configured to compute a network ID for the battery monitoring device based on the non-modifiable node ID. The battery management system further includes a main controller configured to communicate with the battery monitoring device via a communication bus.

These and other advantages and features will become more apparent from the following description taken in conjunction with the drawings.

BRIEF DESCRIPTION OF THE DRAWINGS

FIG. 2 is a diagram of a table utilized by the battery management system of FIG. 1;

FIG. 3 is a diagram of another table indicating a network ID;

DETAILED DESCRIPTION

Figure 1:
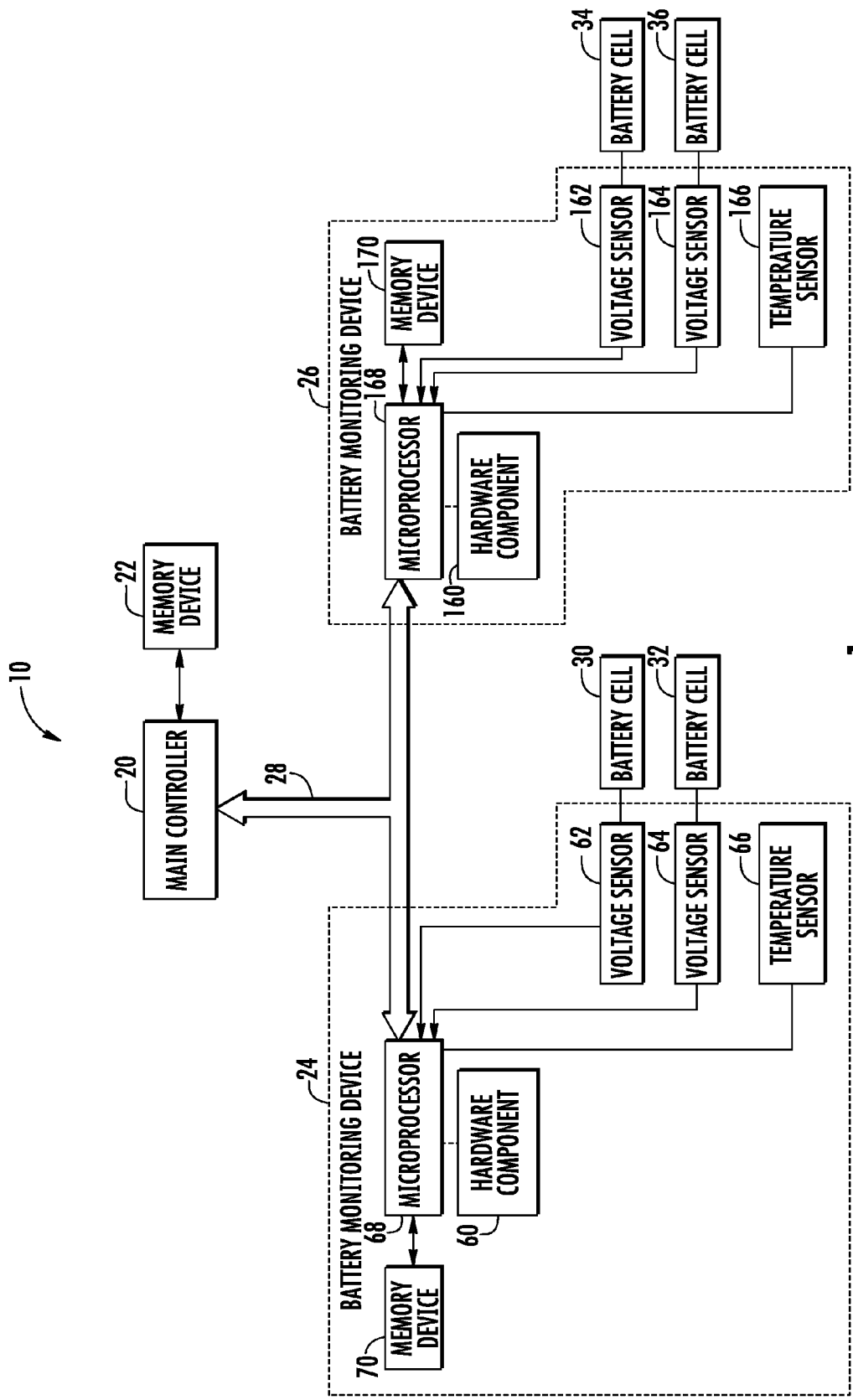
FIG. 1 is a block diagram of a battery management system in accordance with exemplary embodiment.

Referring to the FIG. 1, a block diagram of a battery management system 10 for monitoring battery cells and controlling operation of the battery cells in accordance with an exemplary embodiment is provided. The battery management system 10 includes a main controller 20, a memory device 22, battery monitoring devices 24, 26, a communication bus 28, and battery cells 30, 32, 34, 36. An advantage of the battery management system 10 is that the battery monitoring devices 24, 26 can each self assign a non-modifiable node ID and network ID for communicating through the communication bus 28 with the main controller 20.

The term "non-modifiable node ID" means a node identifier associated with a battery monitoring device that is set at the time of manufacture of the battery monitoring device and cannot be changed thereafter. The term "network ID" is an identifier associated with a device communicating over a communication bus.

The main controller 20 is provided to receive data corresponding to measured operational parameters associated with the battery cells 30, 32, 34, 36 from the battery monitoring devices 24, 26 for monitoring the battery cells and controlling operation of the battery cells. The main controller 20 is operably coupled to a memory device 22 that can store data corresponding to the received operational parameters and other data and software routines. The main controller 20 is further operably coupled to the communication bus 28 for communicating with the battery monitoring devices 24, 26. In one exemplary embodiment, the main controller 20 is implemented utilizing a computer or a microprocessor.

Referring to FIGS. 1 and 2, the main controller 20 is configured to access a table 200 in the memory device 22 that identifies the battery monitoring devices operably coupled to the communication bus 28. In one exemplary embodiment, the table 200 includes three columns: Device No., Node ID, Enabled Map, and Description. Further, the table 200 includes 12 rows corresponding to 12 different battery monitoring devices. For purposes of simplicity, only two battery monitoring devices 24, 26 will be discussed in the illustrated embodiment of FIG. 1. Each Node ID value (i.e., node ID) in the table 200 is a distinct value identifying a specific battery monitoring device. Each Device Number (No.) is a distinct value indicating an ordinal or position of a node ID in the table 200. Each Enabled Map value is a value indicating whether a specific battery monitoring device output is enabled or disabled. In other words, the Enabled Map values allows the main controller 20 to determine which outputs of a battery monitoring device are actually connected and will be reporting an appropriate measured parameter. The Enabled Map allows for increased flexibility for packaging of battery modules containing numerous battery cells since each battery monitoring device can be manufactured to disable particular outputs that become inaccessible due to battery shape and/or configuration. Further, each Description in the table 200 is a binary value indicating whether specific battery cell voltages and temperatures will be measured by a specific battery monitoring device. In one exemplary embodiment, each battery monitoring device is capable of measuring and reporting 10 battery cell voltages and four temperatures per battery module containing the battery cells.

The communication bus 28 routes data bi-directionally between the main controller 20 and the battery monitoring devices 24, 26. Of course, in alternative embodiments, additional battery monitoring devices could be operably coupled to the communication bus 28. In one exemplary embodiment, the communication bus 28 is a CAN bus. Of course, in alternative embodiments, other types of communication buses known to those skilled the art could be utilized.

The battery monitoring device 24 is provided to measure operational parameters associated with the battery cells 30, 32 and to transmit data corresponding to the measured operational parameters to the main controller 20 via the communication bus 28. The battery monitoring device 44 includes a hardware component 60, voltage sensors 62, 64, a temperature sensor 66, a microprocessor 68, and a memory device 70.

The hardware component 60 has non-modifiable node ID information stored therein. In one exemplary embodiment, the hardware component 60 is a set of resistors coupled to the microprocessor 68 and some of which are further coupled to electrical ground. The microprocessor 68 can sample voltages across the resistors to determine a binary value corresponding to the non-modifiable node ID associated with the battery monitoring device 24. In another exemplary embodiment, the hardware component 60 is a non-volatile memory device that has the non-modifiable node ID stored therein. The microprocessor 68 can read the non-volatile memory device to retrieve the node ID associated with the device 24. Of course, in alternative embodiments, other types of devices known to those skilled in the art could be utilized to set the non-modifiable node ID associated with the device 24.

The voltage sensors 62, 64 are provided to measure the output voltages of the battery cells 30, 32, respectively. The voltage sensors 62, 64 transmit signals to the microprocessor 68 indicative of the measured output voltages of the battery cells 30, 32, respectively.

The temperature sensor 66 is provided to measure a temperature level associated with the battery cells 30, 32. The temperature sensor 66 transmits a signal to the microprocessor 68 indicative of a measured temperature level of the battery cells 30, 32, respectively.

The battery cells 30, 32 are electrically coupled to the voltage sensors 62, 64, respectively. In one exemplary embodiment, the battery cells 30, 32 are pouch type lithium-ion battery cells. Of course, in alternative embodiments, the battery cells 30, 32 could be any type of battery cell known to those skilled in the art.

The microprocessor 68 is operably coupled to the hardware component 60, the voltage sensors 62, 64, the temperature sensor 66, and the memory device 70. As discussed above, the microprocessor 68 can sample or read the hardware component 60 to determine a node ID associated with the battery monitoring device 24. Further, the microprocessor 68 is configured to determine a network ID associated with the device 24 based on the node ID to allow bi-directional communication between the device 24 and the main controller 20 via the communication bus 28. In one exemplary embodiment, each node ID is an 8-bit or 1 byte number. Further, in one exemplary embodiment, the bus 28 is a controller-area network ("CAN") bus and each network ID associated with a battery monitoring device is a CAN ID. A standard CAN ID is 11 bits in size. A unique starting CAN ID can be computed for each battery monitoring device by performing an arithmetic shift of a respective node ID to the left by three significant digits to obtain a unique 11-bit number. Further, referring to FIG. 3, an advantage obtained by utilizing the foregoing method for determining the CAN ID is that there is an exclusive range of 8 unique CAN IDs that can be used for each battery monitoring device between two consecutive battery monitoring devices.

It should be noted that a copy of the table 200 is also stored in the memory device 70 and is accessed by the microprocessor 68. The microprocessor 68 determines a device number (designated as Device No. in the table 200) associated with the battery monitoring device 24 utilizing the determined node ID and the table 200. It should be noted that in one exemplary embodiment, the main controller 20 to sends commands having a device number to the battery monitoring devices on the communication bus 28 and the battery monitoring device associated with the specific device number performs tasks in response to the command. For example, the microprocessor 68 can receive a command from the main controller 20 which requests measured operational parameters (e.g., voltage levels and a temperature level) associated with the battery cells 30, 32. In response to the command, the battery monitoring device 24 measures the operational parameters and transmits data corresponding to the operational parameters to the main controller 20.

The battery monitoring device 26 is provided to measure operational parameters associated with the battery cells 34, 36 and to transmit data corresponding to the measured operational parameters to the main controller 20 via the communication bus 28. The battery monitoring device 46 includes a hardware component 160, voltage sensors 162, 164, a temperature sensor 166, a microprocessor 168, and a memory device 170. The battery monitoring device 26 operates in a substantially similar manner as the battery monitoring device 24, except that the battery monitoring device 26 measures the operational parameters associated with the battery cells 34, 36 and reports the associated operational parameters to the main controller 20. Further, the battery monitoring device 46 utilizes a distinct device number, node ID and network ID associated with the battery monitoring device 46, for bi-directional to communication with the main controller 20.

Figure 4:
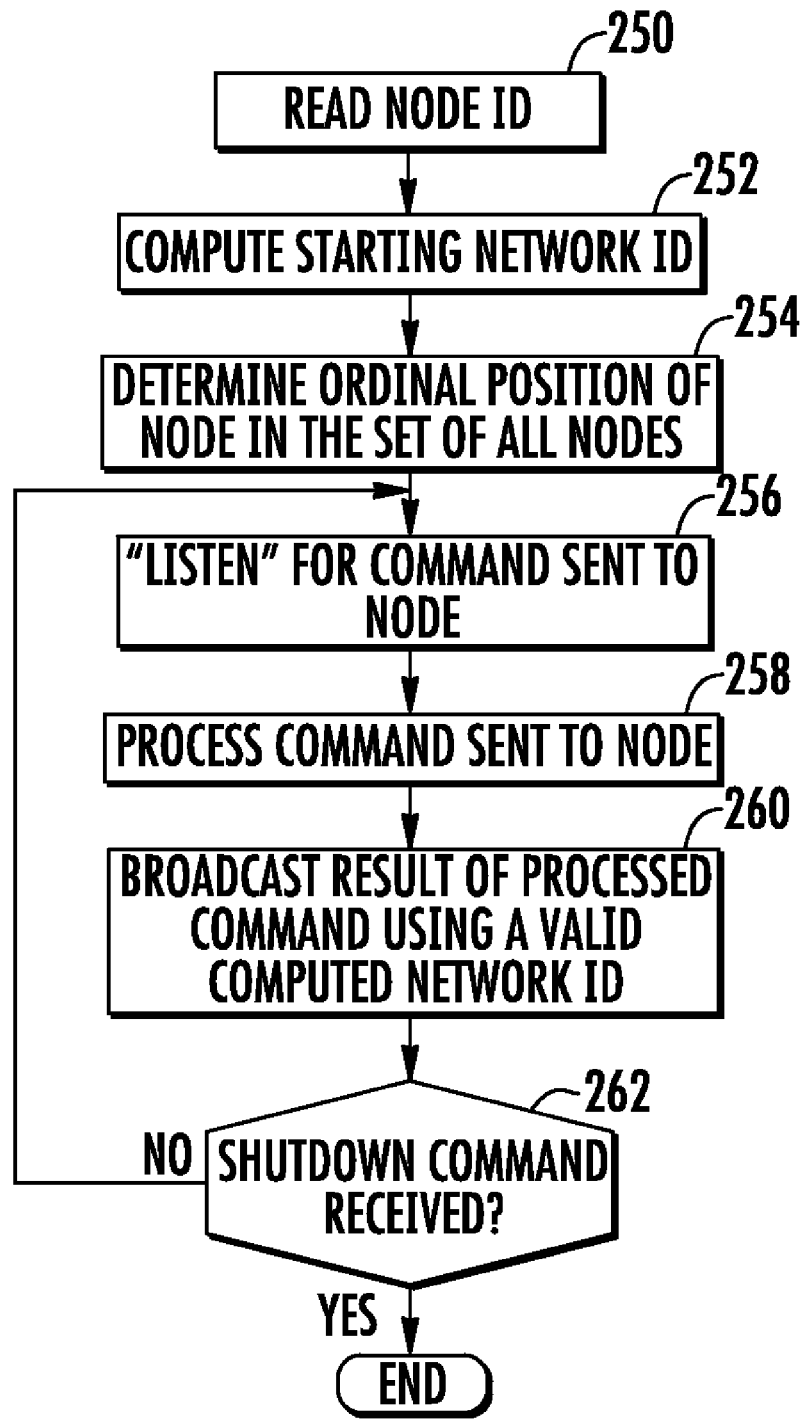
FIG. 4 is a flowchart of a method for transferring data within the data management system of FIG. 1.

Referring to FIG. 4, a flowchart of a method for transferring data within the battery management system 10 will be described. Also, for purposes of simplicity, the following method will be discussed with respect to the battery monitoring device 24.

At step 250, the microprocessor 68 of the battery monitoring device 24 determines the non-modifiable node ID associated with the battery monitoring device 24 by sampling or reading the hardware component 60.

At step 252, the microprocessor 68 determines a network ID associated with the battery monitoring device 24 based on the node ID associated with the device 24.

At step 254, the microprocessor 68 determines an ordinal position of the node ID associated with the device 24 in the table 200 that lists the node IDs of the battery monitoring devices coupled to the communication bus 28. In other words, the microprocessor 68 determines the device number associated with the device 24.

At step 256, the microprocessor 68 listens for a command sent to the battery monitoring device 24 from the main controller 20 via the communication bus 28.

At step 258, the microprocessor 68 processes a command sent to the battery monitoring device 24 by the main controller 20. For example, the microprocessor 68 can receive a command from the main controller 20 which requests measured operational parameters (e.g., voltage levels and a temperature level) associated with the battery cells 30, 32. In response to the command, the battery monitoring device 24 measures the operational parameters and transmits data corresponding to the measured operational parameters to the main controller 20.

At step 260, the microprocessor 68 broadcasts the result of the processed command to the main controller 20 using the network ID associated with the battery monitoring device 24. In other words, the microprocessor 68 transmits data corresponding to the measured operational parameters to the main controller 20 via the communication bus 20.

At step 262, the microprocessor 68 makes a determination as to whether a shutdown command was received from the main controller 20. If so, the microprocessor 68 shuts down the battery monitoring device 24. If not, the method returns to the step 256.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description.

We claim:

1. A method for transferring data within a battery management system, the battery management system having a battery monitoring device, a communication bus, and a main controller, the method comprising:
    identifying a non-modifiable node ID uniquely assigned to the battery monitoring device and stored in a hardware component of the battery monitoring device, by using a microprocessor of the battery monitoring device which accesses the hardware component;
    computing a network ID for the battery monitoring device based on the non-modifiable node ID, by using the microprocessor;
    measuring operational parameters associated with at least one battery cell, by using the battery monitoring device; and
    transmitting data corresponding to the measured operational parameters from the microprocessor through the communication bus to the main controller, by using the network ID.

2. The method of claim 1, further comprising:
    receiving, by the microprocessor, a command from the main controller which requests data corresponding to the operational parameters associated with the at least one battery cell; and
    measuring the operational parameters of the at least one battery cell in response to the command by using the battery monitoring device.

3. The method of claim 1, wherein the battery management system further comprises a memory which stores a table listing a device number of the battery monitoring device in association with the non-modifiable node ID thereof, the method the further comprising:
    determining the device number by using the table based on the identified non-modifiable node ID.

4. A battery management system, comprising:
    a battery monitoring device having a microprocessor and a hardware component, the microprocessor configured to identify a non-modifiable node ID uniquely assigned to the battery monitoring device and stored in the hardware component by accessing the hardware component, configured to obtain operational parameters associated with at least one battery cell, and configured to compute a network ID for the battery monitoring device based on the non-modifiable node ID; and
    a main controller configured to communicate with the battery monitoring device via a communication bus by using the network ID.

5. The battery management system of claim 4, wherein the microprocessor is further configured to transmit data corresponding to the measured operational parameters through the communication bus to the main controller by using the network ID.

6. The battery management system of claim 4, further comprising:
    a memory which stores a table listing a device number of the battery monitoring device in association with the non-modifiable node ID thereof, wherein the main controller is configured to determine the device number by using the table based on the identified non-modifiable node ID.

7. A method for transferring data within a battery management system, the battery management system having a battery monitoring device, a communication bus, and a main controller, the method comprising:
    identifying a non-modifiable node ID associated with the battery monitoring device from a hardware component of the battery monitoring device, utilizing a microprocessor of the battery monitoring device;
    computing a network ID for the battery monitoring device based on the non-modifiable node ID, utilizing the microprocessor;
    calculating a device number associated with the battery monitoring device based on the non-modifiable node ID, utilizing the microprocessor of the battery monitoring device;
    receiving a command from the main controller at the microprocessor, the command having the device number associated with the battery monitoring device, the command requesting data corresponding to the operational parameters associated with at least one battery cell;
    measuring the operational parameters of the at least one battery cell in response to the command utilizing the battery monitoring device; and
    transmitting data corresponding to the measured operational parameters from the microprocessor through the communication bus to the main controller, utilizing the network ID.

8. The method of claim 7, wherein the microprocessor is configured to compute the network ID by performing an arithmetic shift of a plurality of bits of the non-modifiable node ID associated with the battery monitoring device.

* * * * *